United States Patent [19]

Hudson et al.

[11] 4,437,171
[45] Mar. 13, 1984

[54] ECL COMPATIBLE CMOS MEMORY

[75] Inventors: Edwin L. Hudson, Santa Clara; Stephen L. Smith, Sunnyvale, both of Calif.

[73] Assignee: Intel Corporation, Santa Clara, Calif.

[21] Appl. No.: 337,617

[22] Filed: Jan. 7, 1982

[51] Int. Cl.³ ............................................. G11C 11/40
[52] U.S. Cl. ..................................... 365/177; 357/43
[58] Field of Search ............... 365/177, 182, 184, 189, 365/230; 357/43

[56] References Cited
U.S. PATENT DOCUMENTS 4,276,616 6/1981 Hennig ................................ 365/177

Primary Examiner—Terrell W. Fears
Attorney, Agent, or Firm—Blakely, Sokoloff, Taylor & Zafman

[57] ABSTRACT

CMOS buffers are described which provide compatibility between a CMOS circuit and ECL circuits. The input buffer includes a comparator referenced to the $V_{BB}$ potential. This potential is developed on the CMOS chip with bipolar transistors integrally formed during the CMOS processing. The output buffer also utilizes a bipolar transistor and includes overshoot protection circuitry to prevent overshooting in the transition on the output line from a high potential to a low potential.

18 Claims, 6 Drawing Figures

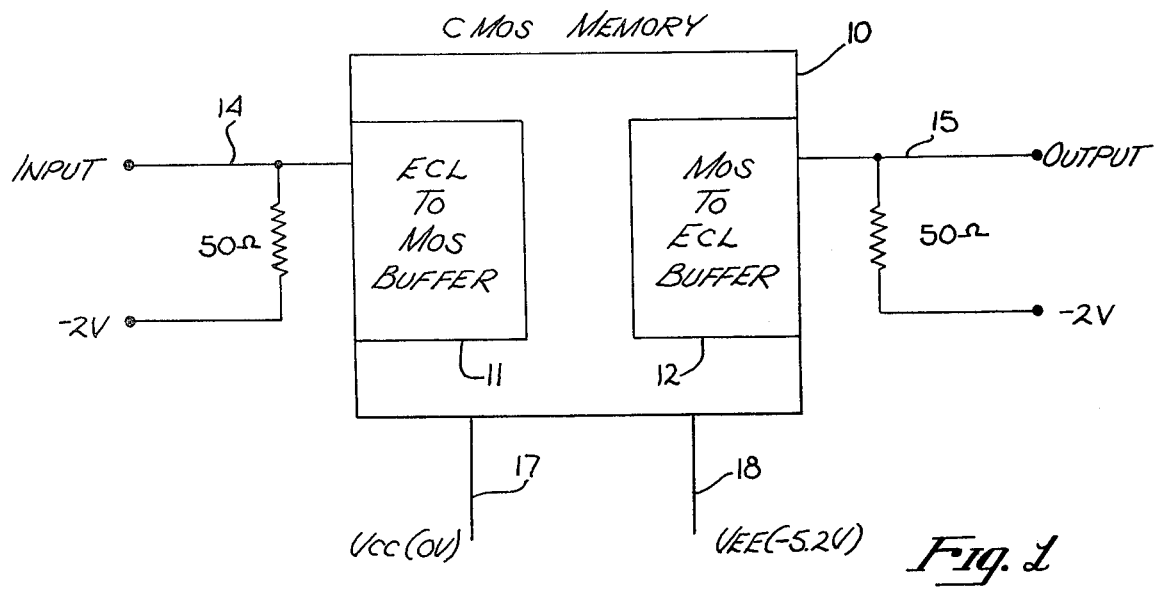
Fig. 1
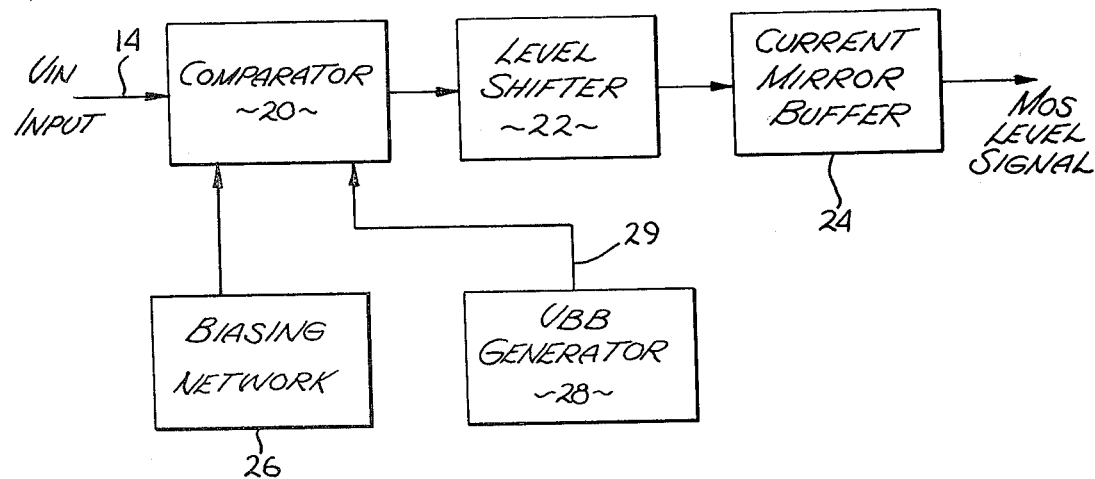
Fig. 2 ECL TO MOS BUFFER

MOS TO ECL BUFFER

VBB GENERATOR

ECL COMPATIBLE CMOS MEMORY

BACKGROUND OF THE INVENTION

1. Field of the Invention

The invention relates to the field of metal-oxide-semiconductor (MOS) circuits compatible with emitter-coupled-logic (ECL) circuits.

2. Prior Art

It is a common practice to use more than a single circuit type, or logic type in an electrical system. For example, a metal-oxide-semiconductor (MOS) central processing unit may interface through buses with peripheral units adapted to receive transistor-transistor-logic (TTL) level signals. Often, MOS circuits include buffers which enable the circuits to receive TTL level signals and to provide output signals which are TTL compatible. Examples of TTL to MOS buffers are described in U.S. Pat. No. 4,048,518.

There have been some attempts to fabricate MOS circuits which are compatible with emitter-coupled-logic (ECL) circuits. An ECL compatible MOS memory is described in U.S. Pat. No. 3,938,109. One disadvantage to this memory is that it requires external generation of a reference potential used to assure proper sensing of the relatively small voltage swing of the ECL signal.

Other circuits for interfacing between different kinds of logic families are described in U.S. Pat. Nos. 3,916,215 and 4,135,103.

In addition to the above patents, a search by Applicant uncovered the following patents:

U.S. Pat. Nos. 3,622,812; 3,965,367; 3,976,892; 4,032,795; 4,147,940; 4,192,016; 4,229,670.

As will be seen, the present invention provides, integral with an MOS integrated circuit, input and output buffers which are ECL compatible.

SUMMARY OF THE INVENTION

A buffer for receiving a signal from an emitter-coupled-logic (ECL) circuit which buffer is formed integrally with a metal-oxide-semiconductor (MOS) circuit is described. The buffer receives the ECL signal and provides the larger voltage swing needed for MOS compatibility. A comparator means is used for receiving the ECL signal and for comparing it with a predetermined reference potential. This reference potential is generated within the integrated circuit. The output of the comparator is coupled to a level shifting means which shifts the level of the signal resulting from the comparison. An amplification means is then used to amplify the shifted signal, with the amplified signal being MOS compatible.

BRIEF DESCRIPTION OF THE DRAWINGS

FIG. 1 is a diagram illustrating the coupling of an MOS circuit and in particular, a CMOS circuit with an ECL circuit.

FIG. 2 is a block diagram illustrating the ECL to MOS buffer of the present invention.

DETAILED DESCRIPTION OF THE INVENTION

An emitter-coupled-logic (ECL) compatible metal-oxide-semiconductor (MOS) circuit is described. In particular, a complementary MOS (CMOS) circuit which is ECL compatible is described in detail. The following description refers primarily to non-voltage compensated 10k ECL, an industry standard. However, it has application to other ECL standards.

In the following description, numerous specific details are set forth such as specific MOS transistor conductivity types, etc., in order to provide a thorough understanding of the present invention. However, it will be obvious to one skilled in the art that the present invention may be practiced without these specific details. In other instances, well-known circuits and processing steps have not been described in detail in order not to obscure the present invention in unnecessary detail.

In the presently preferred embodiment, the described input and output buffers are used to provide ECL compatibility with a CMOS static random-access memory. Ordinary bistable memory cells are used in the memory array. Process details for fabricating the memory, including the input and output buffers are described in U.S. Pat. No. 4,282,648.

Figure 3:
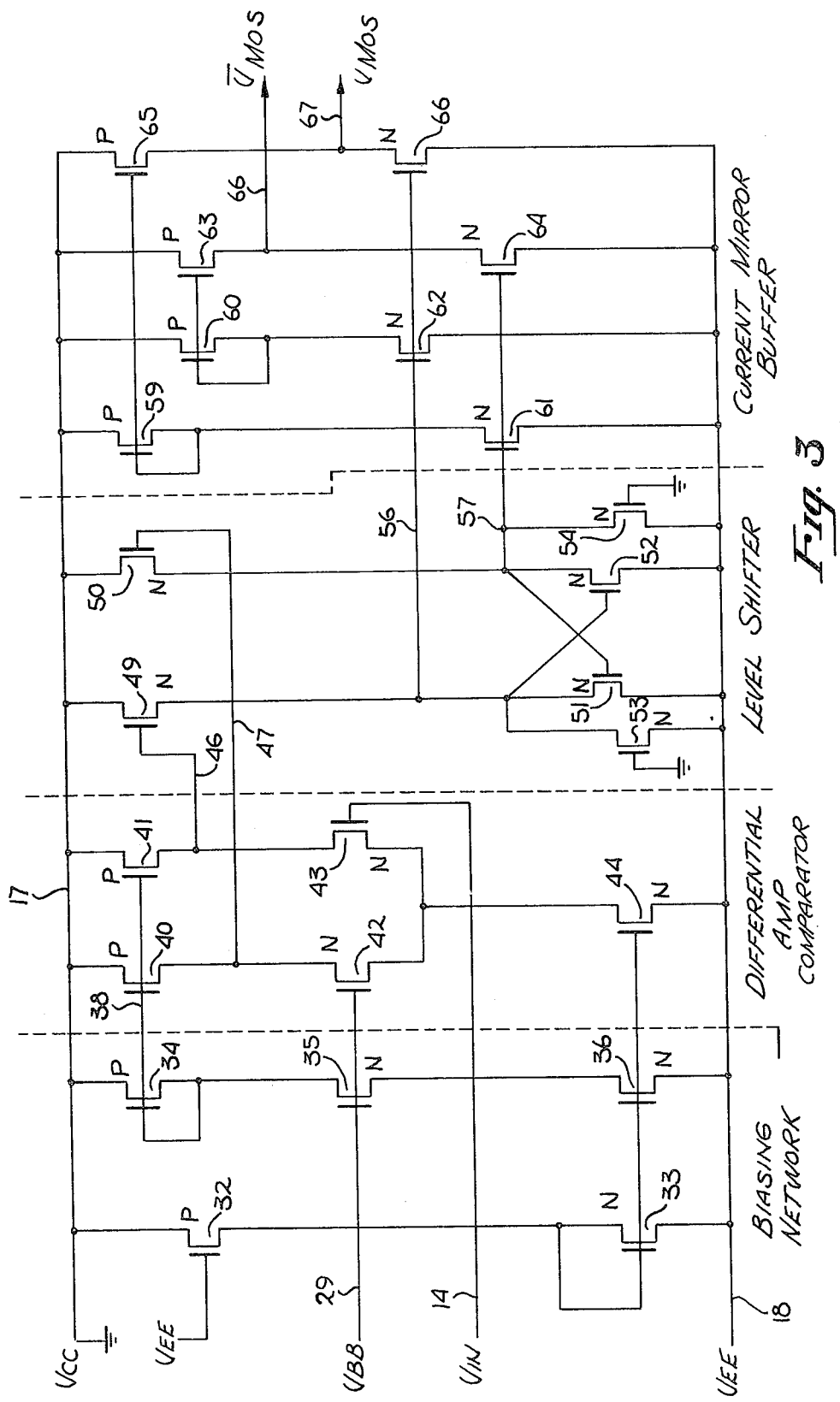
FIG. 3 is an electrical schematic of the ECL to MOS buffer of FIG. 2.
Figure 4:
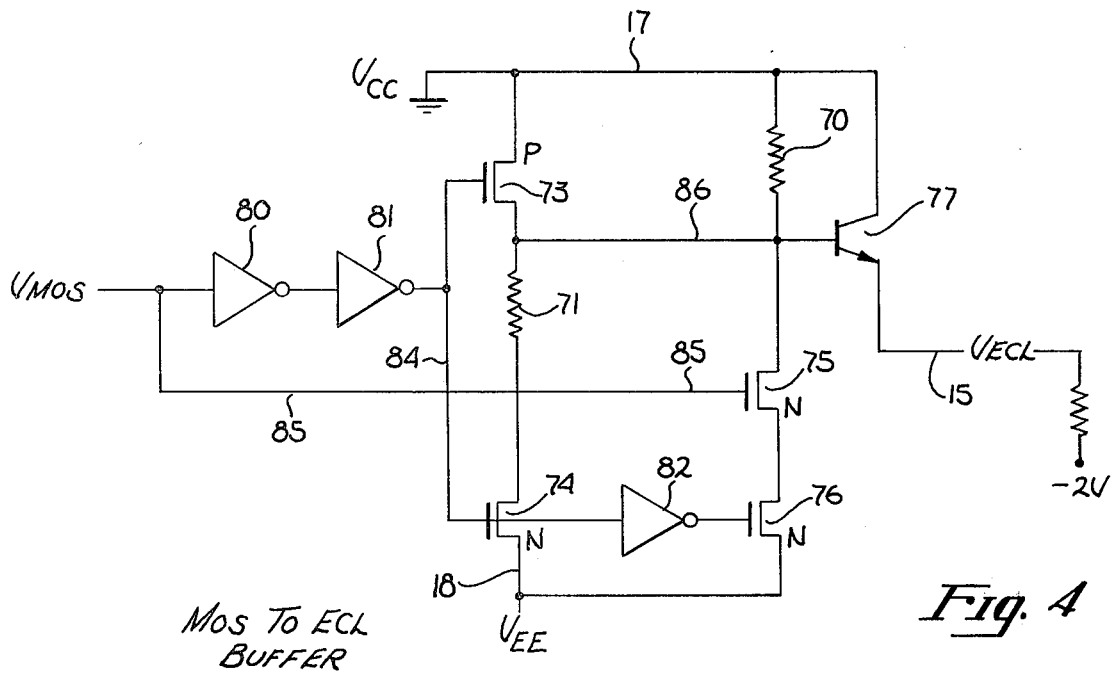
FIG. 4 is an electrical schematic of the MOS to ECL buffer of the present invention.
Figure 5:
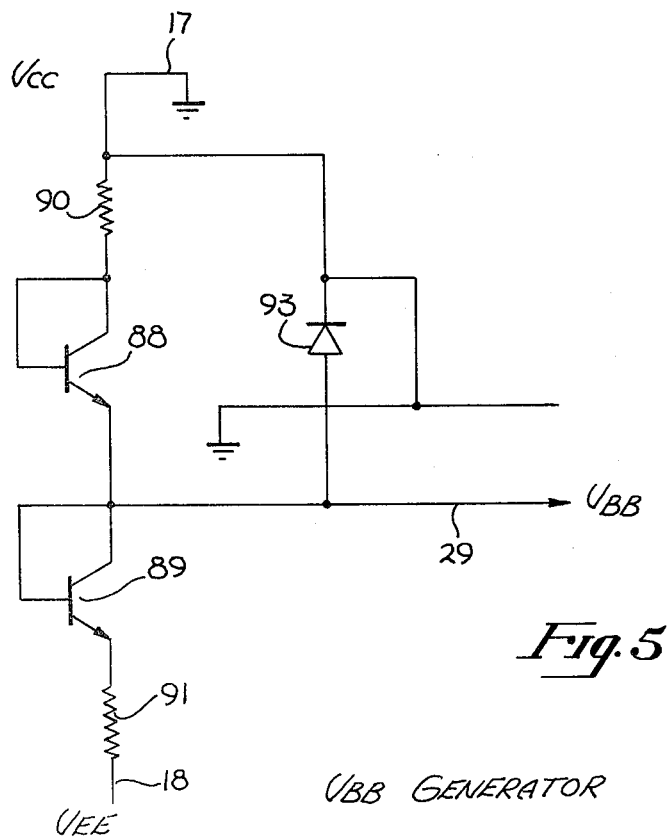
FIG. 5 is an electrical schematic of the reference voltage generator formed integrally with the MOS circuit.

Referring first to FIG. 1, a CMOS memory 10 is illustrated which is coupled to receive an ECL signal on line 14 and which provides an ECL output signal on line 15. An ECL to MOS buffer 11 which is partly the subject of the present invention, provides compatibility between the signal on line 14 and the CMOS memory 10. This buffer is illustrated in FIGS. 2 and 3. The reference voltage generator used with this buffer is illustrated in FIG. 5. The MOS to ECL buffer 12 provides an ECL compatible signal on line 15; this buffer is illustrated in FIG. 4. The CMOS memory 10 receives a negative potential of −5.2 volts ($V_{EE}$) and is grounded through line 17 ($V_{CC}$).

As is typically the case, the input ECL signal on line 14 is terminated in a 50 ohm resistor; one end of this resistor is coupled to a potential of −2 volts. Typical input ECL signal levels are −0.7 volts (high) and −1.8 volts (low), however, the precise values are specified as a function of temperature and supply voltage. The upper level of the ECL signal can be as low as −1.0 volts, while the lower level can be as high as −1.6 volt. The MOS buffer 11 converts the ECL signal to a signal which, in its upper state, is approximately 0 volts (VCC), and in its lower state, is approximately −5.2 volts (VEE).

The MOS to ECL buffer 12 converts the CMOS signal of 0 volts or −5.2 volts to an ECL signal. One problem is that the ECL signal should not overshoot its upper limit of −0.7 volts. If this occurs, the transistor receiving this signal may become saturated; this will slow the performance of the receiving circuit.

Referring now to FIG. 2, the ECL to MOS buffer includes a comparator 20 which receives the ECL input signal on line 14. This signal is compared with a reference potential $V_{BB}$ generated by generator 28 and coupled to comparator 20 via line 29. The potential $V_{BB}$ lies between the upper and lower levels of the ECL signal. A biasing network 26 is used to bias the comparator circuit as will be described. The results of this comparison is coupled to a level shifter 22. The level shifter shifts the signal so that it can be used to drive the MOS buffer 24. The shifter 22 also provides gain. The current mirror buffer 24 amplifies the signal from the level shifter 22 and provides an MOS level signal, as will be described.

In FIG. 3, the buffer of FIG. 2 is shown in detail. The comparator 20 of FIG. 2 is realized as a differential amplifier. This amplifier includes the n-channel transistors 42 and 43 coupled in series with the p-channel transistors 40 and 41, respectively. These two branches are coupled to the n-channel transistor 44 which operates as a constant current source. The gate of transistor 42 receives the reference potential while the gate of transistor 43 receives the ECL signal. Transistors 40 and 41 operate as load devices and thus complementary "difference" potentials are present on lines 46 and 47.

The biasing of the differential amplifier is done with a current mirror circuit which includes the p-channel transistor 32 coupled in series with the n-channel transistor 33. The gate of transistor 32 is coupled to the negative potential $V_{EE}$. This causes transistor 32 to act as a reference current source. This, of course, establishes a substantially identical current in transistor 33. With the gate of transistor 33 coupled to the gate of transistor 44, the current in transistor 33 is "mirrored" into transistor 44. If, for example, the current in transistor 33 is "I" approximately the same magnitude of current will flow in transistor 44, if transistor 44 has the same channel dimensions. However, if the second transistor such as transistor 44 has a wider or narrower channel (assuming the same channel length), the current will vary proportionately to the channel width. Thus, if the channel width of transistor 44 is twice as wide, the current in transistor 44 will be 2I. In this manner, once the current is established in the first stage (transistors 32 and 33) a proportionately larger or smaller current can be "mirrored" into the second stage. The current through transistor 44 is set to assure that transistors 42 and 43 operate in a region where relatively high gain occurs and where no switching occurs. That is, transistors 42 and 43 both continually conduct.

The gate of transistor 33 is also coupled to the gate of transistor 36 and thus a predetermined current is substantially established in transistors 34, 35 and 36. Transistor 35 has its gate coupled to receive the $V_{BB}$ potential to cause the current flowing through these three series transistors to more closely match, in a scaled fashion, the current flowing through transistor 44. The gate of the p-channel transistor 34 is coupled through line 38 to the gates of the p-channel transistors 40 and 41. This causes transistors 40 and 41 to operate as current mirror loads which further stabilizes the operation of the differential amplifier. As presently implemented, the differential amplifier provides a gain of approximately 5 to the difference signal sensed by it.

Figure 8:
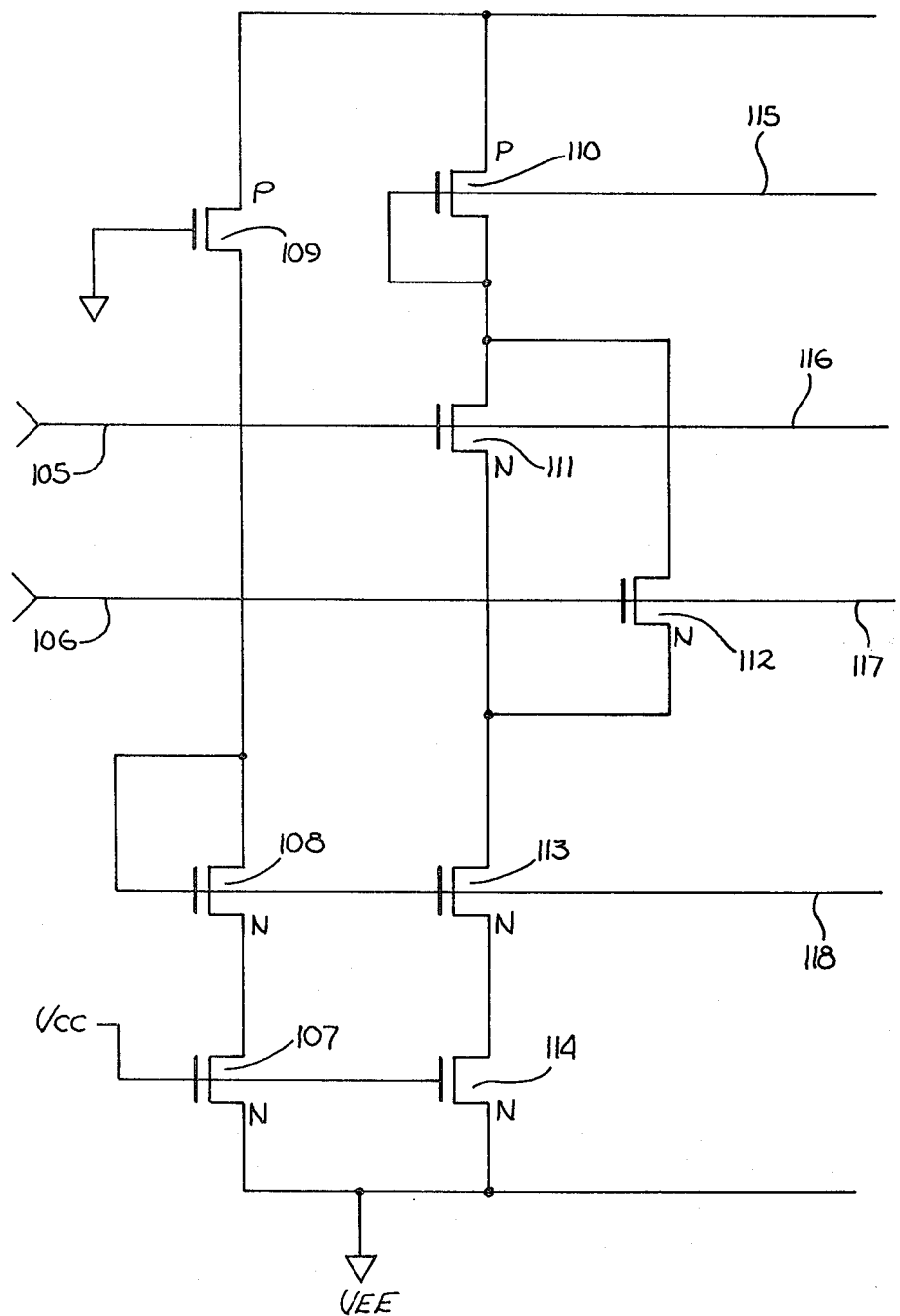
FIG. 8 is an electrical schematic of an alternate bias network to the bias network of FIG. 3. The bias network of FIG. 8 is used as part of a sense amplifier in the invented memory.

The differential amplifier with a modified biasing network is used in the memory as a sense amplifier for the cells. The modified bias network is shown in FIG. 8. Complementary bit lines 105 and 106 are coupled to the biasing network with extensions of these lines (116 and 117) being coupled to the differential amplifier. Lines 116 and 117 are coupled to transistors equivalent to transistors 42 and 43 of FIG. 3. The first stage of the biasing network includes transistors 108 and 109 which correspond to transistors 33 and 32, respectively of FIG. 3. The second stage of the biasing network receives both complementary bit line signals for self-biasing, instead of $V_{BB}$. This self-biasing is achieved by the configuration of transistors 111 and 112. Transistor 110 of FIG. 8 corresponds to transistor 34 of FIG. 3. Line 115 is coupled to the gates of the load devices of the differential amplifier. Transistor 107 and 114 provide additional biasing to compensate for modifications made to the differential amplifier current source.

The level shifter includes a pair of n-channel transistors 51 and 52 which are cross-coupled. One node of this cross-coupled arrangement is coupled through the n-channel transistor 53 to $V_{EE}$, similarly, the other node is coupled to $V_{EE}$ through the n-channel transistor 54. Transistor 51 is coupled to $V_{cc}$ through the n-channel transistor 49, and similarly, transistor 52 is coupled to $V_{CC}$ through the n-channel transistor 50. The gate of transistor 49 is coupled to line 46; the gate of transistor 50 is coupled to line 47.

The level shifter tends to operate as a bistable latch. However, transistors 53 and 54 bleed current from lines 56 and 57, preventing the circuit from fully latching in either of its two possible stable states. Transistors 49 and 50 which receive the driving signal from the differential amplifier stage essentially operate as source followers to propagate the difference signal, although these transistors also operate as load devices. Since the complementary driving signal is coupled to transistors 49 and 50, the signal levels as sensed on lines 56 and 57 are shifted downward (more negative). As presently implemented, the level shifter also provides a gain of approximately 2.5.

The current mirror buffer operates in a push pull configuration to provide an MOS compatible signal on line 66 and its complement of line 67. Two current mirror stages are employed to drive the output inverter stages, with cross coupling between the current mirror stages.

The first current mirror stage includes the p-channel transistor 59 coupled in series with the n-channel transistor 61. The gate of transistor 61 is coupled to line 57. The potential on line 57 establishes a current in transistor 61 and 59. This current is mirrored through transistor 59 to establish a current in transistor 65. Similarly, the p-channel transistor 60 is coupled in series with the n-channel transistor 62. The current in these transistors is established by the potential on line 56. This current is mirrored through transistor 60 to the p-channel transistor 63.

The output stages of the current mirror buffer includes the p-channel transistor 63, coupled in series with the n-channel transistor 64. The gate of transistor 64 receives the signal on line 57. These transistors operate as an inverter, except that transistor 63 receives a driving potential from transistor 60. Likewise, the p-channel transistor 65 is coupled in series with the n-channel transistor 66. The gate of transistor 66 is coupled to receive the signal on line 56 while transistor 65 is driven through transistor 59.

By way of example, the difference potential on lines 46 and 47 is about 500 mv centered about halfway between VCC and VBB. The difference potential on lines 56 and 57 is approximately 1.5 volts, however, centered about −3 volts. The output potential on lines 66 and 67 is 0 in the high state, and approximately −5 volts in the low state. Thus, a full swing is obtained which provides a MOS compatible signal.

Referring now to FIG. 5, the $V_{BB}$ generator illustrated is a relatively standard circuit used for generating the $V_{BB}$ potential in ECL circuits. The circuit includes resistor 90, coupled in series with an npn bipolar transistor 88. This combination is coupled in series with a bipolar transistor 89 and a resistor 91. An output signal ($V_{BB}$) is obtained on line 29. A diode 93 is used as a capacitor to filter the $V_{BB}$ reference voltage. Typically, the circuit of FIG. 5 is fabricated from discrete devices or is formed as an integrated circuit as part of a bipolar integrated circuit. However, with the present invention the circuit of FIG. 5 is fabricated with the MOS integrated circuit.

Figure 6:
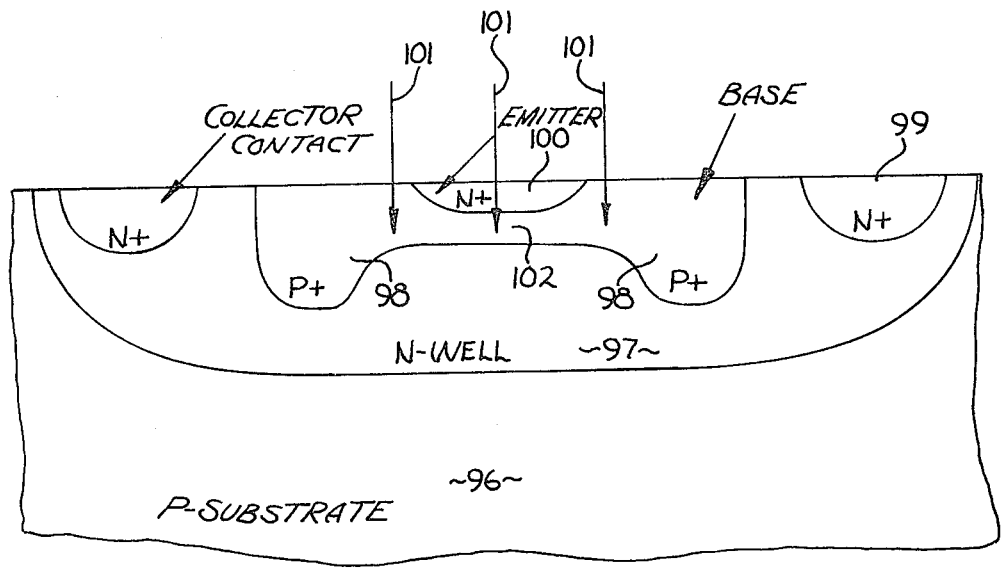
FIG. 6 is a cross-sectional elevation view of a substrate illustrating one of the bipolar transistors formed as part of the CMOS circuit.
Figure 7:
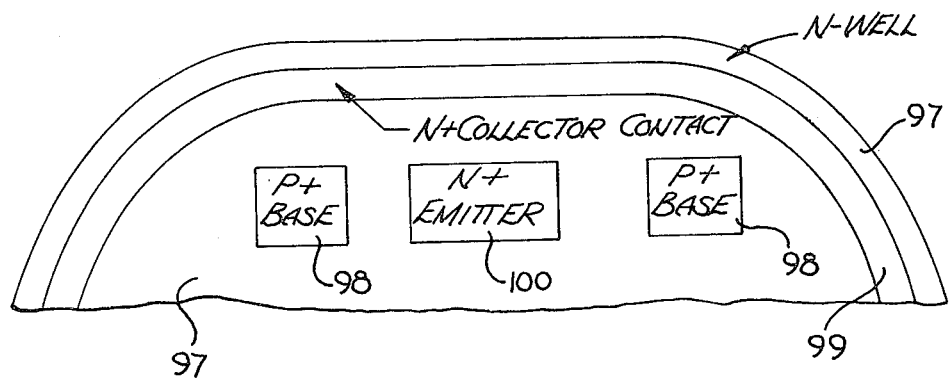
FIG. 7 is a plan view of the substrate of FIG. 6.

The resistors 90 and 91 are formed by n-type diffusions in the substrate. The absolute value of these resistors is not critical, but rather their ratio determines the $V_{BB}$ output potential. In FIGS. 6 and 7, one of the npn transistors of FIG. 5 is illustrated. The transistor is fabricated in an n-type well 97 which serves as the collector. It includes the n+ collector contact region 99, the base region (regions 98 and 102) and an emitter region 100.

The presently preferred CMOS process used for fabricating the circuits of the present invention leads itself to the simultaneous fabrication of integral bipolar transistors (that is, the bipolar transistors are formed on the same substrate.) As described in U.S. Pat. No. 4,282,648, the n-well 97 is formed before the formation of the field oxide regions. P-type regions forming the p+ base contact regions 98 are formed within the n-wells for the bipolar transistor. During subsequent processing the n-type source and drain regions are formed for the n-channel transistors. During this doping step, the collector regions 99 and emitter region 100 is formed.

With this CMOS process, a second p-type doping step is used to form "bridge" regions which extend the first doped p-type regions to the edges of the gates of the p-channel transistors. (See FIG. 9 of U.S. Pat. No. 4,282,648.) During the formation of these bridge p-type regions the region 102 of FIG. 6 is formed. The implantation of this region, as shown by lines 101, is done through the emitter region 100. In this manner, during the fabrication of the CMOS memory, bipolar transistors are fabricated for the $V_{BB}$ generator of FIG. 5 and also for transistor 77 of FIG. 4.

The MOS to ECL buffer of FIG. 4 includes the bipolar transistor 77, the emitter of which provides the output ECL signal when terminated in the standard 50 ohm resistor as shown. The base terminal (line 86) of this transistor is coupled to $V_{CC}$ through the resistor 70 and the p-channel transistor 73. Line 86 is coupled to the $V_{EE}$ potential through the n-channel transistors 75 and 76; this line is also coupled to $V_{EE}$ (negative supply) through resistor 71 and transistor 74. The gate of transistor 75 receives the MOS level output signal while the gate of transistor 76 receives the same signal after it has passed through inverters 80, 81 and 82. Transistors 73 and 74 have gates coupled to receive the MOS level signal on line 84.

To understand the operation of the circuit of FIG. 4, it is easiest to first consider only the resistors 70 and 71 and transistors 73, 74 and 77. When the MOS level signal on line 84 is low, transistor 73 conducts while transistor 74 is off. Line 86 is then pulled to $V_{CC}$. The output on line 15 is then one (silicon) PN junction diode drop below $V_{CC}$ or −0.7.

When the signal on line 84 is high, transistor 73 is off and transistor 74 conducts. The resistance ratio of resistors 70 and 71 determines the potential on the base terminal of transistor 77. This ratio in the presently preferred embodiment, is 80/200 providing a potential of approximately −1.5 volts on line 86. Again, considering the diode drop associated with transistor 77, the output potential on line 15 is somewhat lower than the desired low level potential for ECL circuits, however, it is considered acceptable. Undershooting of the potential does not cause the problems of overshooting.

During the transition on line 15 from a high signal to a low signal, overshooting can occur. When transistor 73 is turned-off its capacitance bootstraps line 86 above $V_{CC}$. Transistors 75 and 76 along with inverters 80, 81 and 82 prevent any significant overshooting. At first examination, it would appear that complementary signals are applied to the gates of transistors 75 and 76, and thus, these transistors would appear to have no effect on the potential of line 86. However, the potential applied to transistor 76 is somewhat delayed when compared to the potential applied to the gate of transistor 75. This delay occurs because of the inherent delay associated with inverters 80, 81 and 82. When the potential at the input of inverter 80 is in a low state (line 15 high), transistor 75 is off while transistor 76 conducts. When a transition occurs at the input of inverter 80 (low state to a high state), this transition is immediately coupled through line 85 to transistor 75. Transistor 75 immediately begins conducting. When the delayed signal arrives at transistor 76, it causes this transistor to cease conducting. However, during the period of this delay (a few nsec.), both transistors 75 and 76 conduct and prevent the potential on line 86 from rising. This prevents an overshooting on line 15. This overshooting, if it occurs as mentioned, is somewhat critical since it can saturate transistors in subsequent (external) stages and slow the speed of these subsequent stages.

Thus, MOS buffers have been described which provide compatibility between ECL circuits and CMOS circuits. In a typical memory, the described input buffer is used to receive data in, address signals, control signals such as chip select and other timing signals. The output buffer is used to provide output data; although obviously both buffers can be used to provide compatibility for other signals.

We claim:

1. In a metal-oxide-semiconductor (MOS) circuit, a buffer for receiving a signal from an emitter-coupled-logic (ECL) circuit and for converting said ECL signal to an MOS compatible signal, comprising:
    a comparator means for receiving said ECL signal and for comparing it with a predetermined reference potential;
    level shifting means, coupled to said comparator means, for shifting the signal level resulting from said comparison;
    amplification means for amplifying the signal shifted by said level shifter, said amplification means coupled to said level shifter; and,
    reference potential means integral with said MOS circuit for generating said predetermined reference potential,
    whereby said ECL signal is converted to an MOS compatible signal.

2. The buffer defined by claim 1 wherein said comparator means comprises a differential amplifier.

3. The buffer defined by claim 2 including biasing means for biasing said differential amplifier.

4. The buffer defined by claim 3 wherein said biasing means comprises a current mirror circuit for maintaining biasing currents in said differential amplifier.

5. The buffer defined by claim 1 wherein said amplification means includes a current mirror stage used for establishing a current in an output inverter stage.

6. The buffer defined in claim 1 wherein said level shifter includes a pair of cross-coupled transistors and means for preventing said cross-coupled transistors from becoming latched in a stable state.

7. The buffer defined by claim 1 wherein said reference potential means includes bipolar transistors.

8. In a complementary metal-oxide-semiconductor (CMOS) circuit, a buffer for receiving a signal from an emitter-coupled-logic (ECL) circuit and for converting said ECL signal to an MOS compatible signal, comprising:
    comparator means for receiving said ECL signal and for comparing it with a predetermined reference potential;
    level shifting means for shifting the level of the signal resulting from said comparison, said level shifting means coupled to said comparator means;
    amplification means for amplifying the output of said level shifting means, said amplification means coupled to said level shifting means; and,
    bipolar transistors formed integrally with said MOS circuit for providing said reference potential for said comparator means,
    whereby the output of said amplification means provides an MOS compatible signal.

9. The buffer defined in claim 8 wherein said comparator means includes a differential amplifier.

10. The buffer defined by claim 9 wherein a current mirror circuit is used for providing biasing for said differential amplifier.

11. The buffer defined by claim 10 wherein said level shifting means includes a pair of cross-coupled transistors and means for preventing said transistors from becoming latched.

12. The buffer defined by claim 11 wherein said amplification means includes a current mirror stage used for establishing a current in an output inverter stage.

13. In a complementary metal-oxide-semiconductor (CMOS) circuit a buffer for receiving a metal-oxide-semiconductor (MOS) level signal and for converting said MOS signal to a signal compatible with an emitter-coupled-logic (ECL) circuit, comprising:
    a first and a second resistor, said resistors being coupled in series;
    a first transistor coupled in series with said resistors;
    a second transistor coupled in parallel with said first resistor;
    said first and second transistors being field-effect transistors having their gates coupled to receive said MOS signal; and,
    a bipolar transistor formed integrally with said CMOS circuit, the base terminal of said bipolar transistor being coupled to said first and second resistors;
    whereby said bipolar transistor provides an ECL compatible signal.

14. The buffer defined by claim 13 wherein said first transistor comprises an n-channel transistor and said second transistor, a p-channel transistor.

15. The buffer defined by claim 14 wherein said bipolar transistor comprises an npn transistor and wherein said ECL compatible signal is obtained at the emitter terminal of said npn transistor.

16. The circuit defined by claim 13 including circuit means for preventing said ECL compatible signal from rising in potential when transitioning from its higher level to its lower level.

17. The buffer defined by claim 16 wherein said circuit means comprises:
    a third and fourth field-effect transistor coupled in series with said first resistor
    delay means for delaying said MOS signal before said MOS signal is applied to the gates of said first, second and third transistors;
    the gate of said fourth transistor being coupled to receive said MOS signal without said delay.

18. The buffer defined by claim 17 wherein said delayed MOS signal is the complement of said non-delayed MOS signal.

* * * * *